United States Patent
Khoyi et al.

(10) Patent No.: US 11,586,424 B2
(45) Date of Patent: Feb. 21, 2023

(54) APPLICATION DEVELOPMENT AND EXTENSIBILITY/CUSTOMIZATION USING ENTITY MODELING SYSTEMS AND METHODS

(71) Applicant: Open Text SA ULC, Halifax (CA)

(72) Inventors: Dana Lawrence Khoyi, Westford, MA (US); Albertus Hendrik Roos, Barneveld (NL); Richard Winfield Bolling, Hollis, NH (US); Renatus Cornelis Prins, Putten (NL)

(73) Assignee: OPEN TEXT SA ULC, Halifax (CA)

( * ) Notice: Subject to any disclaimer, the term of this patent is extended or adjusted under 35 U.S.C. 154(b) by 0 days.

(21) Appl. No.: 17/689,144

(22) Filed: Mar. 8, 2022

(65) Prior Publication Data
US 2022/0188080 A1    Jun. 16, 2022

Related U.S. Application Data

(63) Continuation of application No. 16/932,459, filed on Jul. 17, 2020, now Pat. No. 11,294,646, which is a (Continued)

(51) Int. Cl.
| | |
|---|---|
| *G06F 8/60* | (2018.01) |
| *G06F 8/35* | (2018.01) |
| *G06F 8/34* | (2018.01) |
| *G06F 8/36* | (2018.01) |
| *G06F 16/22* | (2019.01) |
| *G06F 30/20* | (2020.01) |
| *G06F 3/0482* | (2013.01) |
| *G06F 3/04847* | (2022.01) |

(52) U.S. Cl.
CPC .............. *G06F 8/35* (2013.01); *G06F 3/0482* (2013.01); *G06F 3/04847* (2013.01); *G06F 8/34* (2013.01);
(Continued)

(58) Field of Classification Search
CPC ....................................................... G06F 8/60
See application file for complete search history.

(56) References Cited

U.S. PATENT DOCUMENTS 6,823,522 B1 * 11/2004 Lamb ...................... H04L 67/08
                                                      709/227
7,681,176 B2      3/2010 Wills
(Continued)

OTHER PUBLICATIONS

Office Action for U.S. Appl. No. 15/587,014, dated Aug. 15, 2022, 25 pgs.
(Continued)

*Primary Examiner* — Jae U Jeon
(74) *Attorney, Agent, or Firm* — Sprinkle IP Law Group

(57) ABSTRACT

Embodiments of systems and methods disclosed herein provide an application development platform in an enterprise computing environment. More specifically, in certain embodiments, systems and methods are disclosed that enable an application development platform to reuse, extend, and/or customize entity-based applications in an enterprise computing environment. The application development platform can extend an entity to include user configured settings including zero or at least one of a property, a permission, an action, a behavior, or a resource to the entity to generate user customized versions of the entity. The applications may be customized by an end user, while allowing the underlying application to be updated without losing any user customizations.

20 Claims, 9 Drawing Sheets

Related U.S. Application Data continuation of application No. 16/207,577, filed on Dec. 3, 2018, now Pat. No. 10,732,939, which is a continuation of application No. 15/586,991, filed on May 4, 2017, now Pat. No. 10,169,004.

(60) Provisional application No. 62/331,785, filed on May 4, 2016, provisional application No. 62/331,797, filed on May 4, 2016.

(52) U.S. Cl.
CPC ............... *G06F 8/36* (2013.01); *G06F 16/22* (2019.01); *G06F 30/20* (2020.01); *G06F 8/60* (2013.01)

(56) References Cited

U.S. PATENT DOCUMENTS

| | | |
|---|---|---|
| 7,823,121 B1 | 10/2010 | Zarrinkoub |
| 8,336,025 B1 | 12/2012 | Hosagrahara |
| 8,627,272 B1 | 1/2014 | Lin |
| 2005/0165822 A1* | 7/2005 | Yeung .................... G06Q 10/10 707/999.102 |
| 2008/0189679 A1* | 8/2008 | Rodriguez ................ G06F 8/34 717/105 |
| 2010/0050097 A1* | 2/2010 | McGreevy ........... G05B 19/409 707/E17.014 |
| 2015/0154277 A1 | 6/2015 | Thornley |
| 2016/0077810 A1 | 3/2016 | Bertilsson |
| 2017/0147311 A1 | 5/2017 | Bregler |
| 2017/0177310 A1 | 6/2017 | Mathias |

OTHER PUBLICATIONS

Final Office Action for U.S. Appl. No. 16/939,238, dated Aug. 11, 2022, 10 Pgs.

Office Action for U.S. Appl. No. 16/939,238, dated Mar. 7, 2022, 16 pgs.

Office Action for U.S. Appl. No. 15/587,014, dated Apr. 12, 2022, 21 pgs.

Notice of Allowance for U.S. Appl. No. 16/939,238, dated Oct. 27, 2022, 7 pgs.

* cited by examiner

AccidentDetails - Form

Components
- Identity
  - Id
  - ItemId
  - EntityType
- Action Buttons  610
  - Delete
  - Print
- Properties
  - Location of accident
  - Date/time of accident
  - Immediate assistance req
  - Driver
  - Status
- Relationship
  - [1..*] Witness
  - [1..*] Damages
  - [0..*] Policy
  - [0..*] Vehicle
  - [0..*] Adjustor Other

Presentation

Align

| Driver | Date/time of accident |

| Location of accident | Status |

| Immediate assistance required | |
| no | |

| Select policy | |

| Select vehicle | Region |

| Adjustor name | |
| - Select - | |

620

Form

▼ Presentation

☑ Default text style
☑ Default label style
☑ Default background

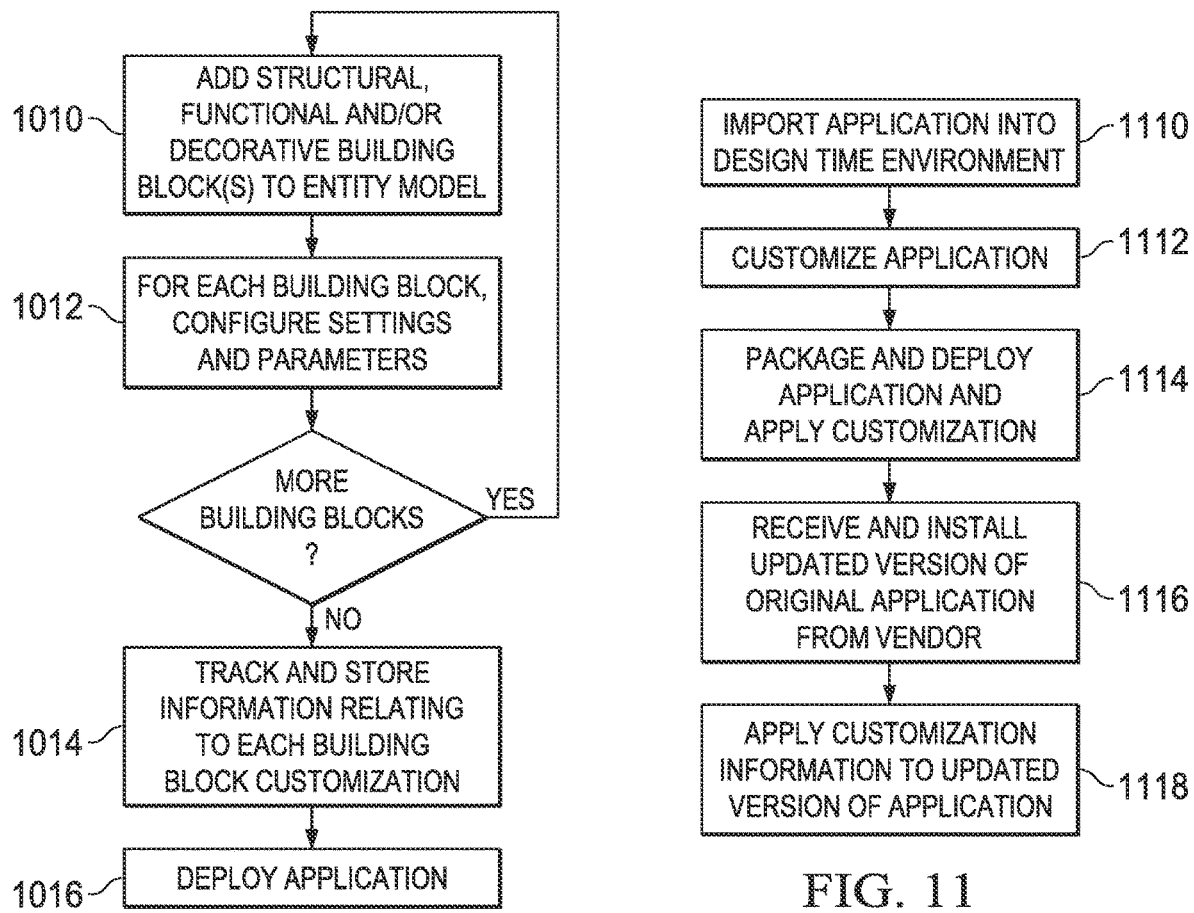
FIG. 10
FIG. 11
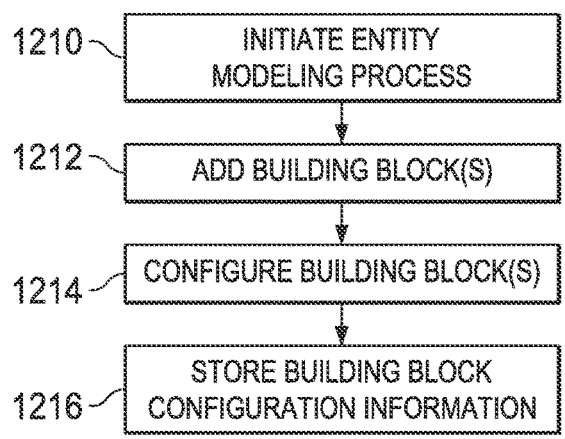
FIG. 12

APPLICATION DEVELOPMENT AND EXTENSIBILITY/CUSTOMIZATION USING ENTITY MODELING SYSTEMS AND METHODS

CROSS-REFERENCE TO RELATED APPLICATIONS

This is a continuation of, and claims a benefit of priority under 35 U.S.C. § 120 from, U.S. patent application Ser. No. 16/932,459, filed Jul. 17, 2020, "APPLICATION DEVELOPMENT AND EXTENSIBILITY/CUSTOMIZATION USING ENTITY MODELING SYSTEMS AND METHODS," which is a continuation of, and claims a benefit of priority under 35 U.S.C. § 120 from, U.S. patent application Ser. No. 16/207,577, filed Dec. 3, 2018, issued as U.S. Pat. No. 10,732,939, "APPLICATION DEVELOPMENT AND EXTENSIBILITY/CUSTOMIZATION USING ENTITY MODELING SYSTEMS AND METHODS," which is continuation of, and claims a benefit of priority from, U.S. patent application Ser. No. 15/586,991, filed May 4, 2017, issued as U.S. Pat. No. 10,169,004, entitled "APPLICATION DEVELOPMENT AND EXTENSIBILITY/CUSTOMIZATION USING ENTITY MODELING SYSTEMS AND METHODS," which claims a benefit of priority under 35 U.S.C. § 119(e) from U.S. Provisional Application Nos. 62/331,785, filed May 4, 2016, entitled "APPLICATION DEVELOPMENT AND EXTENSIBILITY/CUSTOMIZATION USING ENTITY MODELING SYSTEMS AND METHODS," and 62/331,797, filed May 4, 2016, entitled "REUSABLE ENTITY MODELING SYSTEMS AND METHODS." All applications listed in this paragraph are hereby fully incorporated by reference in their entireties, including the appendices attached thereto.

TECHNICAL FIELD

This disclosure relates generally to application development. More particularly, this disclosure relates to application development and customization using an application development platform in an enterprise computing environment. Even more particularly, this disclosure relates to systems and methods for customizing entity models with reusable and extensible building blocks seamlessly integrating an application development platform with a backend database management system in an enterprise computing environment.

BACKGROUND OF THE RELATED ART

In software engineering, an entity model, or entity-relationship model, refers to a particular type of data model that describes and defines a process in a problem domain. This process is modeled as components (entities) that are linked with each other by relationships that specify dependencies and requirements between them.

An entity model can be created by a data modeler using software tools. The entity model thus created can be translated into a physical database design and mapped to physical storage devices by a database administrator (DBA). For example, in the case of a relational database management system which stores data in tables, every row of each table represents one instance of an entity. Some data fields in the tables point to indexes in other tables. Such pointers represent the relationships.

As is known, a database management system is a complex software program that provides users with a systematic way to create, retrieve, update, and manage data. There are a number of problems with an existing approach to entity modeling in an application development environment that relies on data modelers (e.g., the IT staff) knowing how to interact with database management systems, essentially requiring them to have data administration and entity modeling expertise. However, the skills required for entity modeling are different from the skills required for data administration. As such, a data modeler may spend time working on what functionality to add to an entity as well as on figuring out how to correctly and appropriately add that functionality to an entity.

Some existing approaches to entity modeling involve using different software tools. Since the entities and their relationships are stored in a database, these software tools must provide a way to access them in the database. To do so, code for different user interfaces need to be written and implemented and data modelers need to learn how to use these software tools. Moreover, functions provided by one entity modeling tool may not be reusable or extensible by another entity modeling tool.

One example of an entity modeling system has at least one processor, a data store storing a plurality of entity building blocks, at least one non-transitory computer-readable medium, and stored instructions embodied on the at least one non-transitory computer-readable medium. The plurality of entity building blocks may be created separately and independent of any particular entity to be modeled in a process solution (which refers to a particular application that is custom developed/built for a problem domain).

One problem that application developers face is that they frequently need to let their customers customize their applications, while still being able to release updates to the applications. In typical scenarios, this requires the customers to go through the customization process with each new application release.

Another problem in the art relates to polymorphic relationships between entities. For example, an insurance company may have different types of insurance policies, all of which go through a standard claims process. When processing claims, it may be desirable to process all types of claims, without necessarily being concerned about the type of policy.

Another problem in the art relates to how users can effectively use components (e.g., applications, etc.) from third party applications, i.e., applications for which only binaries are available. Enabling a document type to be used as a run-time reference is a challenge, as it may require the introduction of a special class in the modeler's class definition. It can be counterintuitive for a modeler developer to take in to consideration design-time versus run-time availability of various concepts, while being in the phase of domain modeling. In addition, run-time usage of an application component is different from its design-time usage. In other words, some properties of a document are required when used during application development, but are not relevant after the document is deployed. Introduction of run-time reference document types would require thorough insight in the domain and future usage of the included concepts.

It would sometimes be desirable to build applications by reusing, extending, or customizing functionality offered by other applications or application components. More specifically, it would be desirable to enable entity-based applications to be reused, extended, and/or customized in an enterprise environment.

In view of the foregoing, there is a need for innovations and improvements to entity modeling in enterprise computing environments.

SUMMARY OF THE DISCLOSURE

It is an object of the invention to provide innovations and improvements to application development and extensibility/customization using entity modeling in enterprise computing environments. In embodiments disclosed herein, this object is realized in an entity modeling system having at least one processor, a data store storing a plurality of entity building blocks, at least one non-transitory computer-readable medium, and stored instructions embodied on the at least one non-transitory computer-readable medium. The plurality of entity building blocks may be customized by an end user, while allowing the building blocks to be updated without losing the customizations. It is another object of the invention to provide systems and methods for reusing, extending, and/or customizing entity-based applications in an enterprise computing environment.

An entity modeling system may run on an application development platform for creating process solutions that leverage functionality from various enterprise systems such as case management, process management, content management, and systems integration. The application development platform may comprise elements that define the entity modeling system and items that are created by users (e.g., documents, forms, cases, process instances, etc.). The application development platform can automatically extend an entity to include user configured setting including zero or at least one of a property, a permission, an action, a behavior, or a resource to the entity to generate a user-customized version of the entity. Information relating to the user configured settings can be tracked and stored, and used later to incorporate the user configured settings in updated application versions.

Each building block comprises code instantiated from a class to implement certain settings that can be added to an entity. Such settings may be structural, decorative, and/or functional. In some embodiments, decorative and functional building blocks are treated the same way—as structural building blocks. In some embodiments, entity building blocks can be used by entity model builders to assemble or compose entities in a particular project via an entity model designer tool of the entity modeling system. Some entity building blocks can be added to an entity many times, while some entity building blocks can only be added once. Since entity building blocks can be created and managed separately and independently of the entities, there is an open-ended set of possible building blocks that can be added to the entities being modeled. This provides a flexible model for extension (e.g., actions, properties, behaviors, user experience (UX) panels, permissions, REST application programming interfaces (RESTful APIs), etc.).

One embodiment comprises a system comprising at least one processor and at least one non-transitory computer-readable storage medium that stores computer instructions translatable by the processor to perform a method substantially as described herein. Another embodiment comprises a computer program product having at least one non-transitory computer-readable storage medium that stores computer instructions translatable by at least one processor to perform a method substantially as described herein. Numerous other embodiments are also possible.

Embodiments disclosed herein can provide many advantages. For example, embodiments allow application developers to let customers customize their applications, while still being able to release updates to the application without subjecting their customers to undue time or expenses. In other examples, embodiments increase the efficiency systems with polymorphic relationships between entities. In other example, when multiple users customize the same building block or application for their own purposes, the generation of customized building blocks or applications by the users does not affect the customized building blocks of other users. In other examples, embodiments enable the reuse of previously generated application components. For example, embodiments enable the importation and customization of previously generated entity models.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions, and/or rearrangements may be made within the scope of the disclosure without departing from the spirit thereof, and the disclosure includes all such substitutions, modifications, additions, and/or rearrangements.

BRIEF DESCRIPTION OF THE DRAWINGS

The drawings accompanying and forming part of this specification are included to depict certain aspects of the invention. A clearer impression of the invention, and of the components and operation of systems provided with the invention, will become more readily apparent by referring to the exemplary, and therefore non-limiting, embodiments illustrated in the drawings, wherein identical reference numerals designate the same components. Note that the features illustrated in the drawings are not necessarily drawn to scale.

FIG. 6 depicts a diagrammatic representation of an example form editor illustrating reusability of entity building blocks according to some embodiments.

FIG. 7 depicts a diagrammatic representation of a visualization or view of a user interface in the form of an end user homepage.

FIG. 10 depicts a flowchart illustrating one example of a process of a user adding and customizing building blocks to an entity model according to some embodiments.

FIG. 11 depicts a flowchart illustrating one example of a process of a user receiving an application from an application vendor, customizing the application, and the customizations being applied to an updated version of the application according to some embodiments.

FIG. 12 depicts a flowchart illustrating one example of a process of entity modeling according to some embodiments.

DETAILED DESCRIPTION

Figure 1:
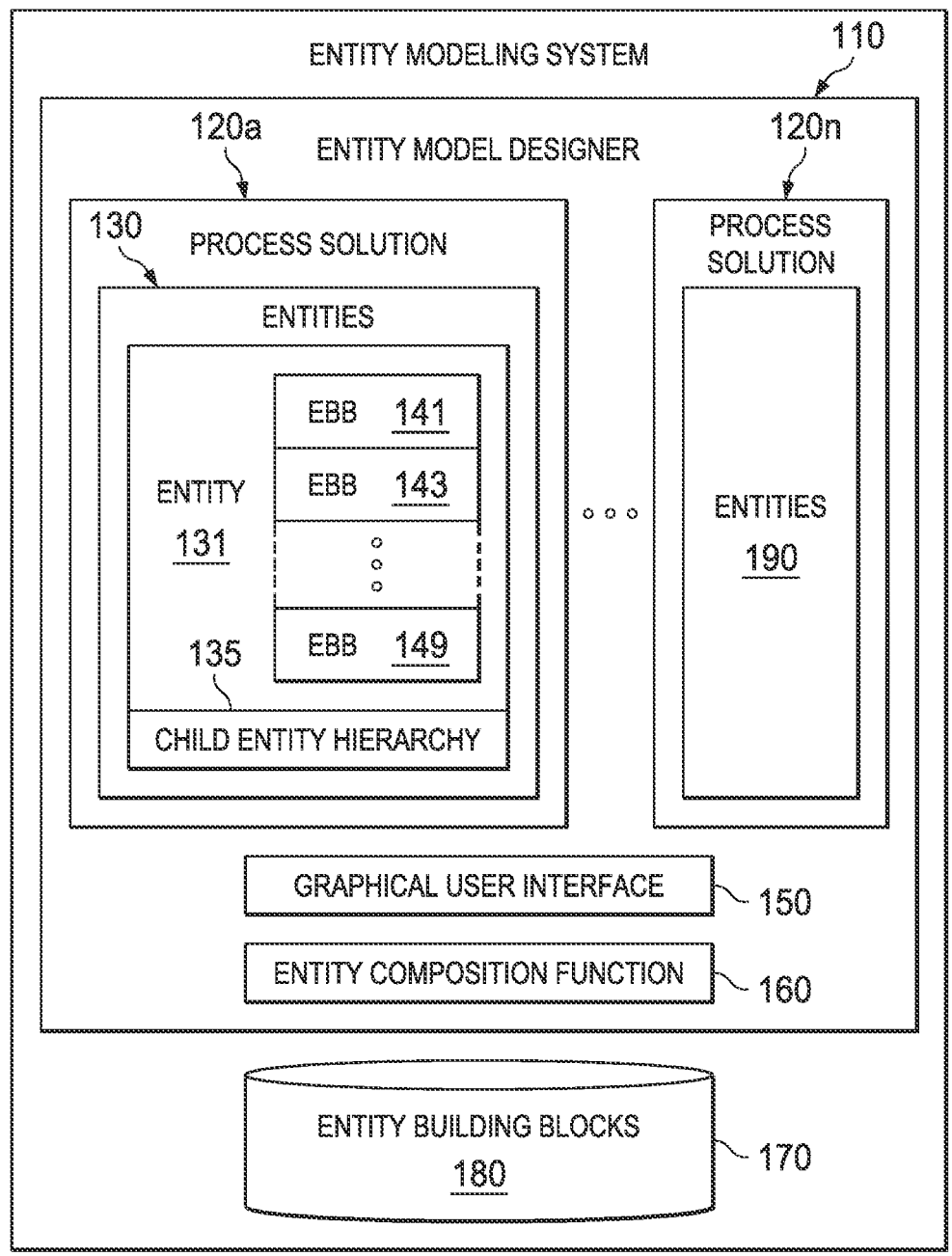
FIG. 1 depicts a diagrammatic representation of an example of an entity modeling system according to some embodiments.

The invention and the various features and advantageous details thereof are explained more fully with reference to the non-limiting embodiments that are illustrated in the accompanying drawings and detailed in the following description. Descriptions of well-known starting materials, processing techniques, components, and equipment are omitted so as not to unnecessarily obscure the invention in detail. It should be understood, however, that the detailed description and the specific examples, while indicating some embodiments of the invention, are given by way of illustration only and not by way of limitation. Various substitutions, modifications, additions, and/or rearrangements within the spirit and/or scope of the underlying inventive concept will become apparent to those skilled in the art from this disclosure.

The invention and the various features and advantageous details thereof are explained more fully with reference to the non-limiting embodiments that are illustrated in the accompanying drawings and detailed in the following description. These embodiments may be better understood with reference to U.S. Pat. No. 10,019,238, entitled "COMPOSITIONAL ENTITY MODELING SYSTEMS AND METHODS," and U.S. Patent Application Publication Nos. US 2016/0203538 A1, entitled "SYSTEMS AND METHODS FOR PRODUCT FULFILLMENT IN A CLOUD-BASED MULTI-TENANCY SYSTEM," and US 2016/0203544 A1, entitled "MULTI-TENANT SUPPLY CHAIN PROVISIONING SYSTEMS AND METHODS," all of which are fully incorporated by reference herein.

As described above, an entity model refers to a particular type of data model that describes and defines a computer-implemented solution process in a problem domain. In computing, such a process (e.g., to eventually find a solution for the problem domain) may result in a computer program product (referred to herein as a solution or application) being created and deployed. Entity modeling may facilitate this process. More specifically, using entity modeling, a solution process can be modeled as entities that are linked with each other by relationships that specify dependencies and requirements between them, in the particular problem domain.

For example, an enterprise may need to model a hiring process which involves modeling entities representing positions needed for the enterprise, entities representing job openings for those positions, entities representing applicants applying for the job openings, entities representing information (e.g., résumés, cover letters, contact information, referrals, etc.) associated with each applicant, entities representing hiring managers, entities representing tasks performed by the hiring managers (e.g., candidate interviews, recommendations, etc.), entities representing hiring decisions, etc., and relationships that specify dependencies and requirements between these entities in the hiring process in a human resource (HR) management domain As another example, in an accounts payable problem domain, a solution process can be defined by a set of entities such as purchase request, purchase order, vendor, invoice, etc. that are linked with each other by relationships that specify dependencies and requirements between them.

Unlike other types of data modeling methods which rely on defining stages, timed phases, etc., entity modeling is entity-based. Each entity—a unit of data that exists as or is perceived as a single separate object—can be considered as representing a piece of information. All of the entities, which represent separate pieces of information in a solution process, together represent a problem domain. To this end, "entity modeling" refers to a way for an application developer, referred to as a solution builder or entity model builder herein, to define these pieces of information, set up relationships (e.g., an applicant may be associated with one or more job openings), specify rules to define constraints (e.g., an applicant must have a minimum of one year work experience), put in processes that define behaviors (e.g., notify a hiring manager when an applicant who is a current employee applies for a different position in the enterprise), add forms (e.g., a recommendation form that a hiring manager has to fill out), define work lists (e.g., queries for searching against entities, for instance, for searching positions based on how long each position has been vacant), and eventually build an application that end users can use for the particular solution process.

Such entities models can be characterized as visual models and the entities can be utilized (e.g., visually and rapidly via a user-friendly interface) to define various elements of an application (a computer-implemented solution), reducing the need for hand-coding and accelerating the development process. This is referred to as low-code application development.

Low-code application development is a new field in information technology and improves upon traditional application development by, for instance, significantly reducing the length of time needed to create and deploy a solution as well as the knowledge and/or skill set needed to code a solution, allowing even non-coders to provide their input while a solution is being developed in the process. Taking a compositional (and visually-driven) approach, embodiments of a low-code application development platform may comprise elements that particularly define an entity modeling system and items (e.g., documents, forms, cases, process instances, etc.) that are created by users. An item in this disclosure may refer to a set of elements that have been assembled into an object. The elements and items, which can be stored in a data stored embodied on a networked server machine, can be partitioned into separately managed solutions.

Unlike traditional application development platforms, users of the entity modeling system seamlessly integrated into and running on the low-code application development platform do not need to be application developers in the traditional sense—they do not need to have knowledge or experience in manual coding and can be application subject matter experts, rather than specialized IT personnel or programmers. For instance, a hiring manager working for an enterprise can develop an HR application for filtering job applicants; an insurance agent can develop a risk analysis application for determining insurance premiums, etc.

Embodiments of an entity modeling system disclosed herein include a user interface and entities that are managed by the same system. Since entities can be defined as part of a computer-implemented process solution, the need to define them using another software tool is advantageously eliminated. Such a process solution has a technical effort of aggregating all of the bits and pieces of information that are needed to solve a particular problem into a single package, unit, or thing that can be manipulated as a single, concrete entity. Examples of process solutions include, but are not limited to: claims processing applications, loan origination applications, employee on-boarding applications, and so on. Embodiments of an application development and customization system using entity modeling disclosed herein are also directed to techniques for reusing, extending, and/or customizing entity-based applications in an enterprise computing environment, as well as providing updated applications to a user that can be implemented by the user while maintaining customizations and extensions configured by the user (described below).

When a computer-implemented process solution is deployed, the low-code application development platform can automatically create/update the database structure needed for the entities defined (via the entity modeling system) in that process solution. This integrated approach to entity modeling is compositional in that a user of the entity modeling system (e.g., a solution builder) can compose or otherwise create an entity by adding/removing entity building blocks (which are special elements of the underlying low-code application development platform) of various kinds. By bringing entities and entity building blocks into the low-code application development platform on which the entity modeling system operates, the low-code application development platform can take over responsibility for when item data (later created by end users of the process solution) is fetched and stored. This eliminates a significant source of errors.

Additionally, any changes to the entity model can be accurately, timely, and correctly reflected in other models such as form models, case models, etc. running on the low-code application development platform. Because an entity model can capture entities with their relationships, a solution builder (who can be a non-coder) can navigate (e.g., visually) and interact directly with entity properties and relations via the user interface of the entity modeling system, significantly reducing the complexity of use.

As a non-limiting example, accessing a property via an eXtensible Markup Language (XML) message can be reduced from this:
GetMortgagesObjectOutput/GetMortgagesObjectResponse/tuple/old/Mortgage/amount/text( )>1000000
to this:
mortgage.amount>1000000

Furthermore, because the relationships are available in the entity model, a form can be utilized to fetch all the required data in a single request. This optimizes performance of browser/server interaction without requiring coding in an application server.

Advantageously, other systems such as case management systems can leverage entities created using the entity modeling system to capture the case data. This enables other systems to maintain relationships with the entities. For example, the form modeling system can automatically enforce validation rules, calculated values, and property interactions JavaScript on the client based on the underlying entity's rules.

In this way, the entity modeling system can provide a central place where entities can be composed or otherwise created by adding/deleting entity building blocks (which can include process logic such as declarative rules and user experience such as forms, layouts, actions, etc.) as appropriate, and the entities thus composed can then be used and reused seamlessly by other systems. In embodiments disclosed herein, an entity building block refers to a container or unit of information containing a piece of code that defines a fundamental nature or characteristic of an entity, that specifies how users interact with an entity, and/or that provides a specific functionality, etc.

In some embodiments, building blocks are functional modules that include two main components—a design component and a run time component. When the run time component of a building block implements its functionality, it implements, optionally, any number of desired interfaces that the system defines. The interfaces may include one or more of a permissions interface (a design time and/or run time permissions interface), a properties interface, an actions interface, a behavior interface, a layout panels interface, an event handlers interface, an API interface, a user interface, etc.

There are many ways to create/modify entity building blocks. In embodiments disclosed herein, entity building blocks are special types of elements in an application architecture based on which the low-code application development platform described above is built. An entity building block, therefore, can be created by implementing a special element class which can be derived from a base element class. This base element class implements the basic methods to manage an element's definition along with element type specific methods to implement the element's functionality. In some embodiments, this may be the only class that need be implemented for some types of elements.

As a non-limiting example, a user may create an entity building block by first starting an application particularly configured for defining entity building blocks. The user may instantiate a specific entity building block from a special element class. The entity building block thus instantiated is an instance of a particular element type from the special element class. Examples of special element classes suitable for implementing entity building blocks are provided below.

For the sake of discussion, and not of limitation, entity building blocks may be arbitrarily categorized as structural, decorative, and functional. "Structural" building blocks may define the fundamental nature of an entity. These may include Property, Relation, Rule, etc. "Decorative" building blocks may specify how users interact with entities. These may include Worklist, Form, Layout, Action Bar, etc. "Functional" building blocks may add "chunks" of functionality to an entity. These may include Security, History, Title, Tracking, etc. Accordingly, the behavior of an entity can be shaped by structural building blocks, the look and feel of an entity can be shaped by decorative building blocks, and the functionality of an entity can be shaped by functional building blocks. Overtime, entity building blocks can be modified and/or extended. Likewise, element types can be created and/or updated in the underlying application development platform.

Once an entity building block is created, it may be registered with the entity modeling system. Any suitable registration method may be used. In some cases, this may entail updating a user interface of the entity modeling system so the newly created entity building block can be displayed in a section of the user interface of the entity modeling system. This allows for an open-ended, very flexible way to add/update/expand entity building blocks. In some embodiments, entity building blocks can be persisted/stored in a data store accessible by the entity modeling system, as shown in FIG. 1.

FIG. 1 depicts a diagrammatic representation of an example of entity modeling system 100. In some embodiments, entity modeling system 100 may operate on an application development platform embodied on one or more server machines such as server computer 1416 described with reference to FIG. 14. The application development platform, integrated with entity modeling system 100, may be referred to as a low-code application development platform. In some embodiments, entity modeling system 100 is configured to operate in conjunction with enterprise systems at the backend, for instance, a database management system that manages database 1418 described below with reference to FIG. 14.

In some embodiments, entity modeling system 100 may include at least one processor, a data store storing a plurality of entity building blocks, at least one non-transitory computer-readable medium, and stored instructions embodied on the at least one non-transitory computer-readable medium and translatable by the at least one processor to provide entity model designer tool 110. Entity model designer tool 110 may have a plurality of components including graphical user interface 150 and entity composition function 160. In some embodiments, a user of entity modeling system 100 (e.g., a solution builder, subject matter expert, etc.) may access entity composition function 160 of entity model designer tool 110 via graphical user interface 150 running on a client device such as builder computer 1415 described with reference to FIG. 14. In some embodiments, entity modeling system 100 may be configured for building computer-implemented, entity-based process solutions 120a . . . 120n for many different real world problems in a networked enterprise computing environment such as enterprise computing environment 1400 described with reference to FIG. 14.

Each entity-based process solution 120a . . . 120n may be defined by a set of entities and their relations, for instance, entities 130 for process solution 120a, entities 190 for process solution 120n, etc. For the sake of brevity, the relations are not separately shown in FIG. 1. Those skilled in the art appreciate that each entity in a process solution may be related or otherwise associated with one or more entities in the same process solution. For example, as illustrated in FIG. 1, entity 131 may be associated with one or more entities and their relationships may be characterized by child entity hierarchy 235. Notice here, however, entity 131 is composed in and managed by entity modeling system 100 in the context of process solution 120a. Furthermore, entity 131 is composed of a plurality of entity building blocks (EBB 141, EBB 143, . . . , EBB 149). These features are further described below.

Figure 2:
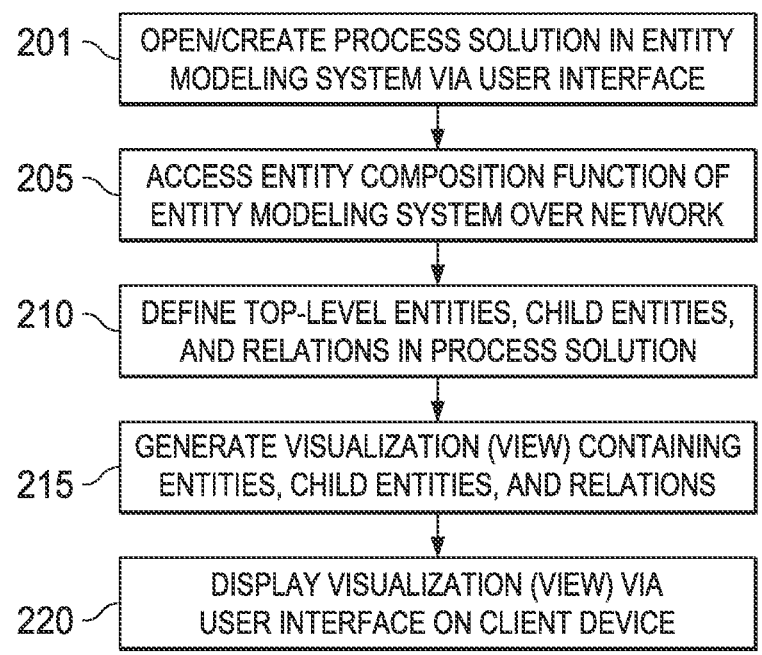
FIG. 2 is a flow chart illustrating an example method for composing an entity in a process solution according to some embodiments.

An example method for composing an entity in a computer-implemented process solution is illustrated by the flowchart in FIG. 2. In some embodiments, a user (e.g., a solution builder) may open or create a process solution (e.g., process solution 120a shown in FIG. 1) in an entity modeling system 100 (e.g., entity modeling system 100 shown in FIG. 1) (201). The user may access an entity composition function (e.g., entity composition function 260 of entity model designer tool 110 shown in FIG. 1) via a user interface (e.g., graphical user interface 150 shown in FIG. 1) running on a client device (205). The user can use the entity model designer tool to define, in the process solution, each top-level entity, its child entities, and relations to other entities (210). Taking an entity-based, or entity-centric, approach, the user interface is updated essentially instantaneously corresponding to user actions/interactions, providing a visualization (e.g., a view on a screen of the client device) for each entity under composition. This visualization or view may include one or more child entity hierarchies that are specific to the entity.

As a non-limiting example, referring to FIG. 1, responsive to an instruction from a user to model an entity, entity model designer tool 110 may generate a visualization (referred to hereinafter as a view) (215) containing a name of the entity and visual components of entity composition function 160 and display the view on graphical user interface 150 (220). An example of such a view is illustrated in FIG. 3.

Figure 3:
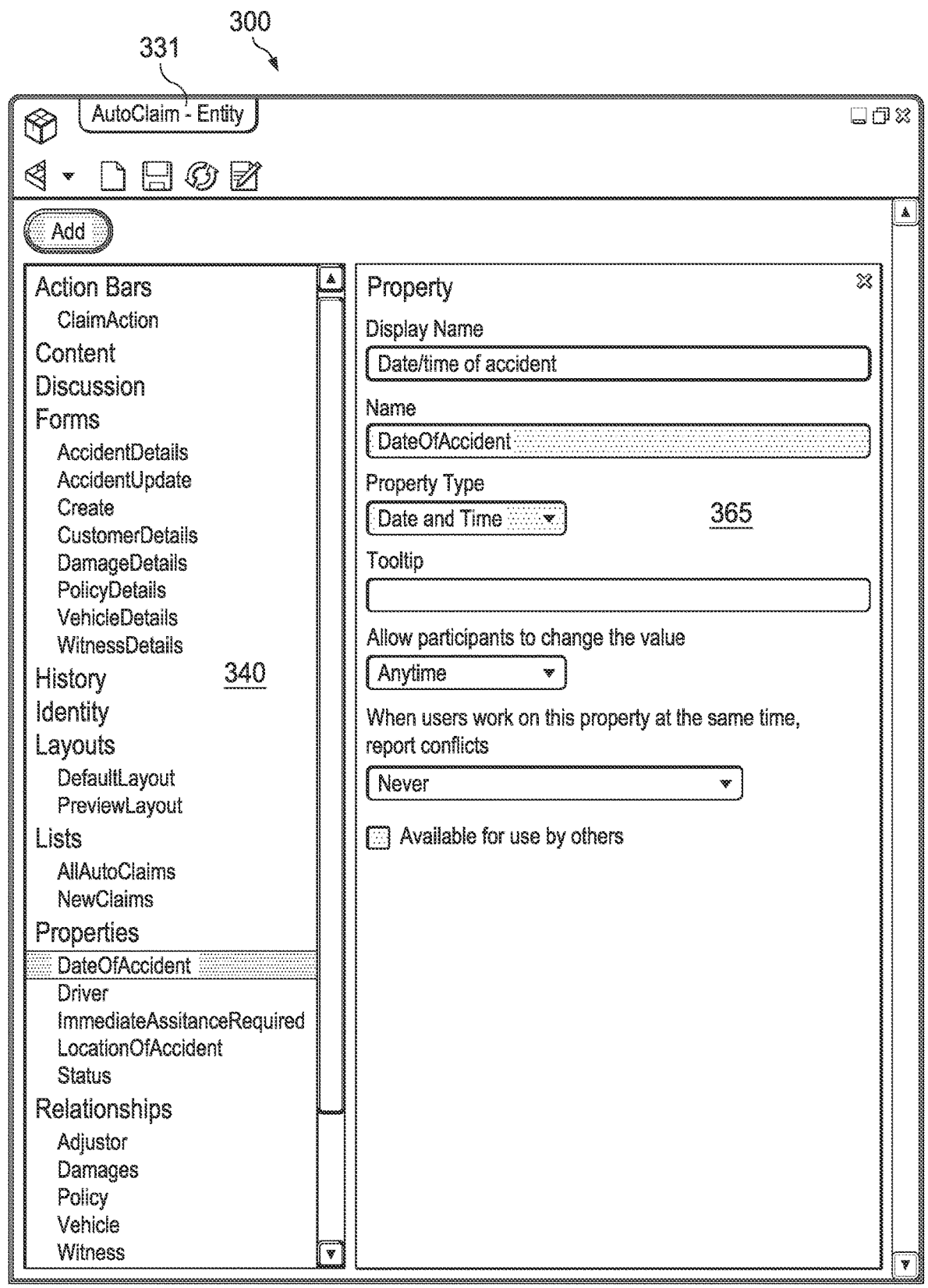
FIG. 3 depicts a diagrammatic representation of a visualization or view of entity composition via a user interface of an entity modeling system utilizing pre-defined entity building blocks from an integrated low-code application development platform according to some embodiments.

As illustrated in FIG. 3, first view 300 may include a name for entity 331 (which is "AutoClaim" in the example illustrated) and visual components of an entity composition function. In the example of FIG. 3, visual components of the entity composition function include an "Add" button corresponding to the functions of the entity composition function. Such visual components allow a user to quickly and easily add/delete entity building blocks 340 relative to entity 331 by interacting with user interface elements such as icons, menus, scroll bar(s), etc. displayed on first view 300, instead of manual coding.

In some embodiments, first view 300 may further include a section or panel for visualizing a collection of pre-defined, registered entity building blocks 340, based on which entity 331 is composed. As described above, a user can quickly and easily add and remove one or more entity building blocks via visual components of the entity composition function which may be implemented as a set of toolbar functions such as an add function for adding entity building block(s) to an entity. A delete function for deleting or removing entity building block(s) from an entity, etc. may also be included. When an entity building block is selected, its configuration form may be displayed in a separate section or panel of first view 300, for instance, in settings section 365. In the example shown in FIG. 3, building block "DateOfAccident" is selected, and its configuration form is displayed in settings section 365. In some cases, when a group of entity building blocks is selected, first view 300 may present options for the group as a whole in settings section 365.

In some embodiments, settings for entity building block(s) are selected via the entity composition function in settings section 365 of first view 300. When no entity building block is selected, settings for the entity under composition may be displayed as a whole in settings section 365 of first view 300 (not shown). In some embodiments, settings section 365 of first view 300 may be configured for displaying entity building block settings in complex forms. Even so, some entity building blocks may require more space than is available in settings section 365. For such entity building blocks, a summary may be presented in settings section 365 and a button/link provided such that information about a particular entity building block can be presented in a separate window.

Figure 4:
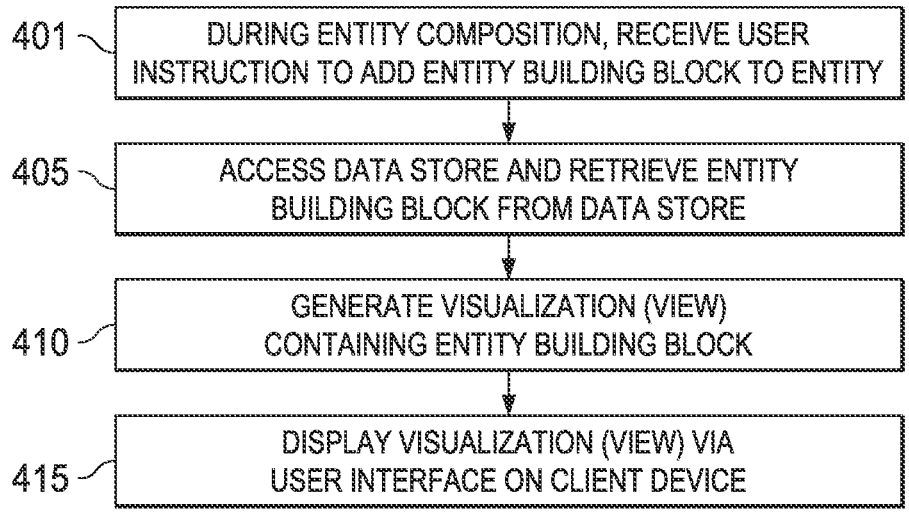
FIG. 4 is a flow chart illustrating an example method for adding one or more entity building blocks to an entity during entity composition according to some embodiments.

Some entity building blocks can be added to an entity many times, others can only be added once. FIG. 4 is a flow chart illustrating an example method for adding one or more entity building blocks to an entity during entity composition. In some embodiments, the system may, via a user interface running on a client device, receive an indication (e.g., a user selecting the add function of the entity composition function shown in FIG. 3) that an entity building block is to be added to an entity under composition (401). Responsive to user interaction with the entity model designer tool (e.g., entity model designer tool 110 of entity modeling system 100 shown in FIG. 1), the system may access a data store where entity building blocks are stored (e.g., data store 170 storing entity building blocks 180, as shown in FIG. 1) and retrieve the desired entity building block from the data store (405). As described above, the data store may store pre-defined entity building blocks that are registered with the system. The system may generate a view that includes the desired entity building block (410) and display the view via the user interface on the client device (415).

Figure 5:
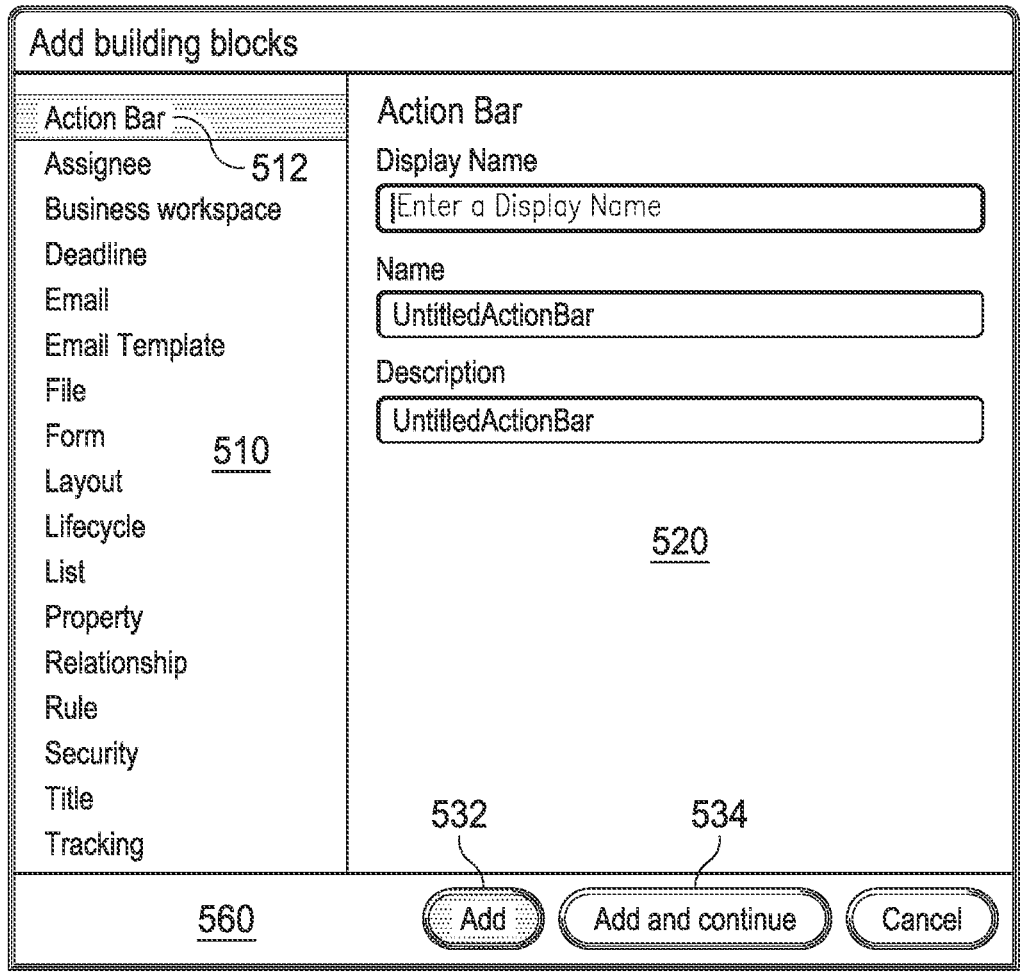
FIG. 5 depicts a diagrammatic representation of a visualization or view of entity composition via a user interface of an entity modeling system utilizing pre-defined entity building blocks from an integrated low-code application development platform according to some embodiments.

FIG. 5 depicts a diagrammatic representation of a visualization or view of entity composition via a user interface of an entity modeling system in which pre-defined, registered entity building blocks can be retrieved from an integrated low-code application development platform and added to an entity under composition according to some embodiments. In the example of FIG. 5, this view is referred to as "Add Building Blocks" dialog 500.

As illustrated in FIG. 5, while using an entity composition function, a user can access Add Building Blocks dialog 500 and choose from building block collection 510 a type of entity building block they wish to add to an entity (e.g., entity 331 shown in FIG. 3). Responsive to an indication that the user wishes to add a particular type of entity building block (e.g., "Action Bar" entity building block 512), the system may instantaneously display configuration form 520 that corresponds to the particular type of entity building block. While entity building blocks are pre-defined and persisted at the backend, some entity building block settings (e.g., parameter values for "Display Name," "Name," "Description," etc.) are user-configurable via configuration form 520 such that a configured entity building block would be particularly suited for the entity under composition. Additional settings may be presented based on the building block type. Some building block settings may be immutable. These may also be displayed in configuration form 520 at the time an entity building block is added to an entity.

In the example of FIG. 5, when the user is done with configuring entity building block 512, the user may invoke add function 532 (e.g., by clicking on a corresponding "Add" button shown in navigation bar 560) to add entity building block 512 to the entity (e.g., entity 331 shown in FIG. 3) and close Add Building Blocks dialog 500. In response, the system may automatically extend the entity to include settings of entity building block 512. The user may wish to continue adding another entity building block. In this case, the user may invoke a repeat function (e.g., by clicking on "Add and continue" button 534 shown in Add Building Blocks dialog 500) to add another entity building block without closing Add Building Blocks dialog 500, making it easier to add many entity building blocks quickly. Each time the add function (which is part of the entity composition function described above) is invoked (either through button 532 or button 534), the system automatically extends the entity under composition to include the entity building block and its associated settings.

As described above, entity building blocks are the bits and pieces of information that a solution builder (user) can use to assemble and customize their entities. Each entity building block adds something to the entity that it is a part of. In addition, each building block can be individually customized by setting/configuring various settings or parameters, as specified by the user, if so desired. Adding (or customizing) a building block to an entity can extend any of the following aspects of the entity, including at least one of a property, a permission, an action, a behavior, or a resource to the entity. These are further described below.

Properties—some entity building blocks can add properties to an entity. One example is a property building block that adds one property. Another example is an assignee building block which can add several properties, such as assignee, assignee type, assignee notification, etc. This type of entity building block can add the concept of responsibility to an entity. For example by assigning an instance to someone, that person is then responsible for taking a required action.

Actions—some entity building blocks can add actions to an entity. For example, actions may be presented to a participant. The actions may also be invoked programmatically. For example, a status building block could add actions such as: start, complete, hold, ignore, restart, and resume (not all of which are available at any given time). Such an action added to an entity can appear in an end user's interface to be triggered interactively. In another example, a status building block could instantly add the concept to status (or state) to an entity. Typically, performing actions on an instance will affect in a change to the status of that instance.

Permissions—some entity building blocks can add permissions to an entity. These permissions can then be granted to roles to control access to the functionality provided by a permission building block. For example, permissions may be used with security policies (which can also be entity building blocks), to control who can do what to instances of the entity. For example, a versioning building block could add the permissions to other building blocks.

Behavior—some entity building blocks can alter the behavior of an entity. For example, a retention building block could prevent an item from being deleted if it has not yet expired. A behavior building block could add event-based logic that is triggered when a specific event takes place relative to an entity. Example events may include access, create, delete, change property, and so on.

APIs—some entity building blocks can extend the programmatic operations available on an entity. For example, a file building block could add a resource to an item resource normally used to manipulate items. As another example, adding other resources can extend the programmatic interface of an entity.

Layout Panels—some entity building blocks can enable the use of additional layout panels in an entity's layouts. For example, if an entity object includes a child entity that includes the a project, status, assignee, supporting items and/or deadline building blocks, the entity object's layout can include a task management panel.

In some embodiments, entity building blocks in an entity modeling system can be arbitrarily divided into broad building block categories/types that can be added to an entity. For example, entity building blocks may be sorted into the following types (each described in more detail below):

Structural building blocks that define the fundamental nature of an entity (e.g., property, relation, rule, etc.);

Functional building blocks that add "chunks" of functionality to an entity (e.g., security, history, title, tracking, etc.); and Decorative building blocks that specify how users can interact with entities (e.g., worklist, form, layout, action bar, etc.).

To understand the capabilities of entity modeling, a process solution builder (user) should understand the entity building blocks that can be used to construct an entity and/or customize an entity. Below is a non-limiting list of example entity building blocks.

Structural Building Blocks:
 Properties—adds the ability to define structured groups of properties.
 Relationships—specify how this entity relates to other entities.
 Rules—adds the ability to add rules to an entity to specify process logic or to create custom actions.
Functional Building Blocks:
 History—adds the ability to track changes to instances of entities in a history log (an audit trail). For example, it may keep track of when instances are created and when these are last modified and by whom.
 Security Policies—adds the ability to define security policies that control access to instances of an entity.
 Title—adds a title that can be used to identify instances of the entity. Having a title on an entity enhances the readability of history linkable where used entries, etc.
 Tracking—adds date/time created and last modified and user who created/last modified instances of the entity.
Decorative Building Blocks:
 Action Presentations—specifies a presentation for the entity's actions. Multiple action presentations may be defined for use in different layouts or for use by different personas.
 Forms—specifies a presentation for the entity's properties. An entity's form may include information from parent, child, or other related entities. Multiple forms may be defined for use in different layouts or for use by different personas.
 Layouts—specifies an overall presentation of an instance of the entity. Multiple layouts may be defined for use by different personas or different states of an instance of the entity.
 Worklists—adds the ability for end users to access lists of instances of the entity. Any number of worklists may be added to an entity and access to worklists can be controlled by security.

As described above, some entity building blocks (e.g., decorative building blocks) the can be added to an entity definition multiple times (and are therefore presented under a group card in one embodiment). Most entity building blocks can only be added once (for example, an entity either has History or it does not). In one embodiment, those that can be added multiple times are presented as a stacked card that can be expanded to see the individual building blocks. In one embodiment, the first time a given type of entity build block is added, the group card is automatically added. Deleting the last instance of a grouped building block deletes the group card.

Structural and function building blocks can alter the basic structure of an entity. For example, adding, removing and, in some cases, changing the settings on these entity building blocks can change underlying database representation of the entity. For the most part, this is neither visible nor important to the solution builder. However, a builder is not permitted to add, remove, or alter these entity building blocks in external entities (see below).

The definitions for some entity building blocks (e.g., Security Policies, Action Presentations, Forms, Layouts, Worklists, etc.) can be large and complex. Adding such a large and complex entity building block may entail opening a new window or tab in the entity model designer tool, as described above.

Some entity building blocks have additional functionality when used in conjunction with other entity building blocks. For example, when the Status and Assign building blocks are used together, additional security permissions are exposed to enable only the Assignee to change the Status.

Embodiments of an entity modeling system disclosed herein can streamline application development in various dimensions:
 Introduce an intuitive way of modeling a problem domain that is close to how an application developer (e.g., a process solution builder) conceptually thinks about it;
 Guide the application developer as much as possible when navigating through the domain model to express process logic;
 Provide an efficient way of adding behavior to an application (e.g., a process solution) by enabling the application developer to select and configure functional modules (e.g., entity building blocks).

These dimensions will be explained in the context of an example problem domain as follows.

Example Problem Domain

Managing insurance information and insurance claims is something almost any insurance company has to deal with. This includes many activities, for example:
 Employees entering new insurance claims, accident details, and relevant related information (e.g., witnesses, damages, policies, vehicles, adjustors, etc.);
 Managers approving or rejecting insurance claims; and
 Employees inspecting the status of insurance claims.

Form-Based Applications

There are a lot of applications that are mainly about data entry, data visualization, and data manipulation. End users interact with such applications through work lists that list items matching various filter conditions and forms through which new information can be entered or existing information can be changed. In addition, the application developer may choose to define actions (buttons) that can be triggered by end users to change the data that's stored in the system.

To this end, the following represents example use cases of the example application (i.e., a particular process solution for the above example problem domain):
 Employees submitting new insurance claims, accident details, and relevant related information
 Managers approving or rejecting insurance claims
 Employees inspecting the status of insurance claims The above use cases can be covered by developing various forms, for example, a form for submitting accident details.

Developing the above parts of the application could either start by modeling the entities that are involved in the use cases or by developing the forms through which the end users perform the listed actions. In the discussion below, it is assumed that application developers start with modeling the entities, as described in detail above. If they would start with developing the forms, the system could still automatically (or with very few inputs from the application developer) create the underlying entities such that the end result of both approaches is (more or less) the same.

Develop Forms

In order for end users to interact with an application's entities, an application developer (e.g., a solution builder) can create forms that specify how an entity's properties are to be displayed. An entity may have a creation form that is presented to end users to fill when they create new items. An entity may have update forms that are presented when items are opened. A form contains any number of components, arranged however the application developer wishes. Most of the components on a form are properties of the entity. These can be presented as data entry fields where an end user can enter values.

From the entity model designer tool, an application developer can add forms to their entities, just like any other entity building block. A form designer or editor (a functional component of the underlying entity modeling system) can present a palette of forms that are accessible via the entity model designer tool.

FIG. 6 depicts a diagrammatic representation of an example form editor illustrating how entity building blocks can be used and/or reused in a visual manner, for instance, by dragging and dropping an entity building block onto a design canvas. In this way, various visual presentations such as forms for an entity can be created quickly and easily.

Specifically, a user (e.g., an application developer) of form editor dialog 600 can select from properties in an entity (which, in this case, represent entity building blocks added to the entity), or navigate the entity's relationships to related entities via components palette 610 of form editor dialog 600. In the example of FIG. 6, components palette 610 also includes various other controls/features that the user can use in their forms. The user can drag and drop representations of desired components (e.g., forms, controls, features, etc.) from components palette 610 onto form canvas 620 and drag and drop them around form canvas 620 to arrange them as desired. Each component is automatically presented using a standard control based on the component type. For example, when adding a property of the type "date" to the form, by default a date picker is added to the form.

When a form component is selected in form canvas 620, the user can specify how that property is to be presented using the controls in presentation control section 630. In some cases, the most significant can be the selection of a component's presentation (e.g., a Boolean property can be presented as a check box, as a pair of radio buttons, or as a drop list).

In addition to the entity's property model, form editor dialog 600 can include other components that enable the application developer to group components into containers, including stacked and tabbed containers and to decorate their form with images, lines, and static text.

The user can drop an entire relationship on form canvas 620. If it is a singular relationship (0 . . . 1), a form container component can be added and the user can choose which of the related entity's forms is to be displayed in the container. If it is a plural relationship (0 . . . N), a repeating item container can be added. This container lists the related items and provides user controls to add and remove related items. Alternatively, the user can choose to navigate through a singular (0 . . . 1) relationship and select individual properties from the related entity and drop them directly on to their canvas.

As described above, an entity may have any number of update forms for use in different contexts. The example application (which represents a process solution) described above is fairly straightforward, and has a single create form and update form for each of the entities thus modeled. A more complex application may present subsets of the information in an item to end users through dedicated forms designed for the various use cases in the application. In some cases, it can be about presenting information to an end user, whereas in other cases the end user is also expected to perform some action.

Note that, unlike some systems, an entity's form described above can be a part of a view or page presented to an end user when an item is opened. For instance, a form can be displayed as a panel within an entity's item layout that may include many panels. A layout may display different aspects of the same entity by including multiple form panels each displaying a different form on that entity. In some cases, an item layout may include an Actions panel to enable a user to trigger actions on the item. A layout may also include other types of panels.

Once an application developer has created forms and work lists, these can be displayed to end users via "home" pages. A home page can be a form which is split up in various panes where each pane can be specified to show a form or work list. All home pages are registered in the system. End users can quickly switch between the various home pages that are available.

Figure 7:
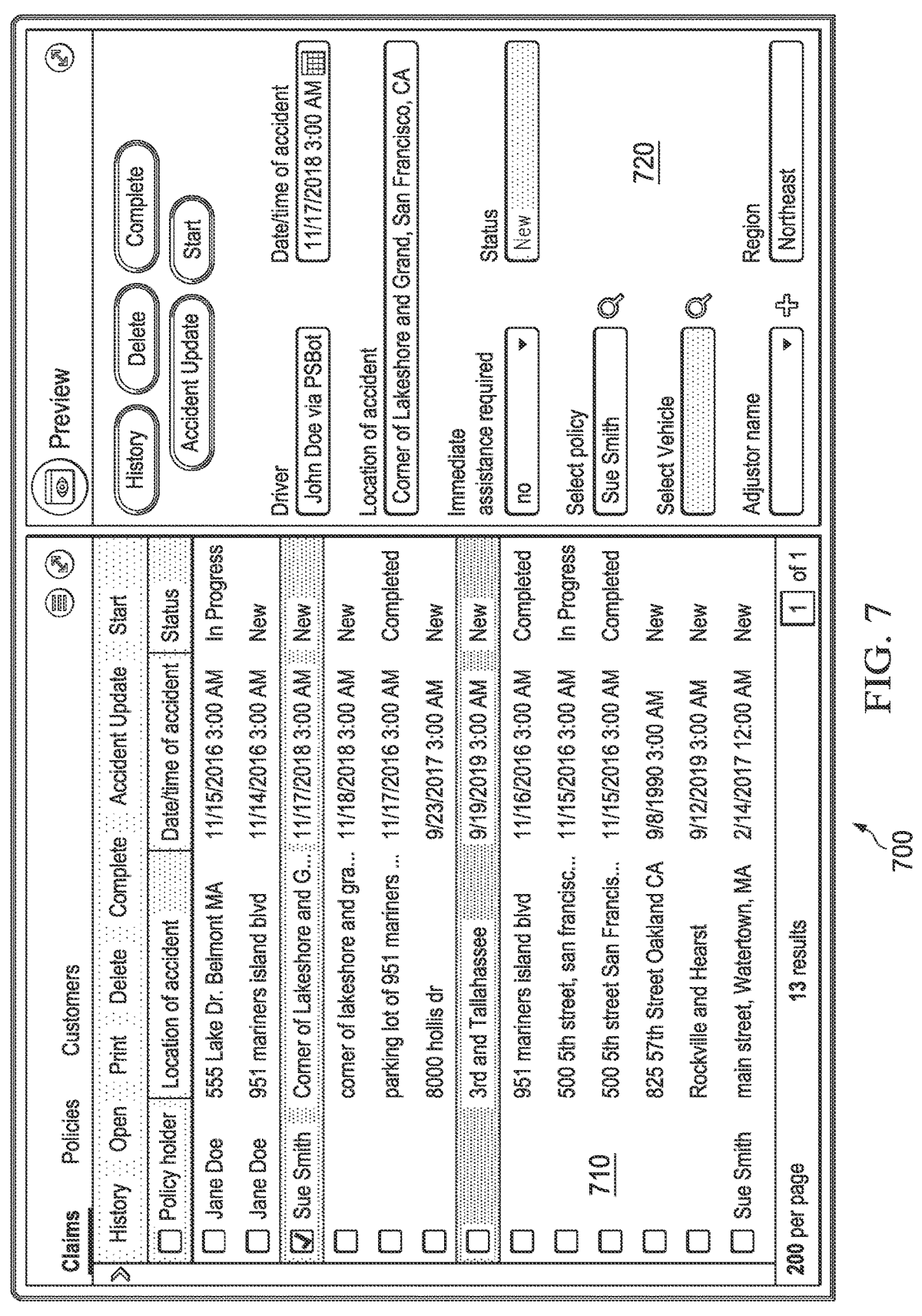

Following the above example, submitting a new insurance claim or accident details can be done through the user experience (UX) as specified by the application's home page. FIG. 7 is a diagram representing one example of a user interface in the form of an end user homepage 700. In this example, the end user homepage 700 allows the end user to choose to view "Claims," "Policies," and "Customers." FIG. 7 shows an example with "Claims" selected. The left pane 710 of the homepage 700 shows information for various records such as the policy holder, accident location, the date/time of the accident, and the status of the insurance claim process. When the end user selects one of the records (in this example, the third record from the top), details are previewed in preview pane 720. In this example, the preview pane 720 displays information relating to an accident, such as the driver, date/time, location, the status, etc. The preview pane 720 also enables the end user to add or edit any information for any fields in which the end user has the appropriate permissions.

As mentioned above, it may sometimes be desirable to build applications by reusing, extending, or customizing functionality offered by other applications or application components. In particular, for example, it would be desirable to enable entity-based applications to be reused, extended, and/or customized in an enterprise environment. For example, assume a first application developer is developing a contact management application. Also assume a second application developer is developing an account management application. In the account management application each account may reference a contact person for that account. Instead of independently developing a contact entity as part of the account management application, the second application developer may desire to use parts of the contact management application developed by the first application developer. In this example, the second application developer would benefit from reusing the contact management application developed by the first developer.

Following are examples of platforms for facilitating the use of application models from other applications, including the identification of problems encountered with enabling the reuse of entities in other applications, as well as solutions to the problems.

As described above, an application development platform provides a development environment to design integrated applications that may contain user interfaces, business processes, roles, etc. As was also mentioned above, an application developer may desire to reuse application models developed by other application developers as part of other applications. Generally, in one example, a developer will create a new model within an application development project which acts as a placeholder for a reusable model (a referenced model). The run-time reference contains the contract of the referenced model, and contains sufficient details of the reference model to enable the developer to build and package the application. In software development, "contract" refers to a type of specification. A contract prescribes that software designers/developers should define formal, precise, and verifiable interface specifications for software components, which extend the ordinary definition of abstract data types with preconditions, postconditions, and invariants. Contracts can be written by code comments, enforced by a test suite, or both. The referenced model is made available in the development environment for other application developers, enabling developers to publish and test the applications. In some embodiments, if the contract of the referenced model is left unchanged, the application will continue to work with newer versions of the referenced model. In some examples, if the contract is changed, the developer may need to adopt the application accordingly.

In some embodiments, an application development platform that allows reuse of entity models may have to address several inherent problems. For example, some challenges relate to scalability. In some embodiments, an application developer may need to create a run-time reference for every model that is referenced. In examples where the contract of multiple referenced models has changed, the application developer may need to reload the run-time references one-by-one. The application developer may also need to delete run-time references one-by-one if they are no longer used or are no longer available. In some examples, if a run-time reference from a separate project in the same workspace is used, a dependency may be created on that project rather than on the package that contains the referenced model. In some examples, to prevent such undesired dependencies, application developers may create multiple copies of the same run-time reference. However, this may also increase the amount of work required to keep all the run-time references updated.

Other potential challenges for a platform developer relate to maintainability of applications. For example, run-time references may be introduced through sub-types of a model type. This potentially may impact the meta model of the designer and may introduce problems when new functionalities are added to the model type.

When a developer references application models of other applications, the sources of the other applications may not be available. In some examples, when referencing models, only the data and behavioral aspects of the other application are used. When a developer uses an entity from another application, the platform makes it possible to let entities have a reference to the other entity. In some examples, it may not be possible to add items such as properties or relationships to the referenced entity itself.

One important consideration when reusing entities relates to an entity's contract. For example, when reusing an entity from another application, it is important to know which aspects of the referenced entity are available for use by the developer. Therefore, in some examples, it may not be sufficient to only know the contract of the entity being referenced, but also understand the relationships to other entities.

In some embodiments, the challenges relating to run-time references described above are addressed by making developer contracts of the models available for use by others by shipping the models as part of the application package. The application packages can be imported into a development environment, enabling the models to be available for use just as if they were available as sources in the same workspace. From the perspective of a builder, at the time of modeling, the builder would see no difference between the builder's own entities and the reused imported entities.

Figure 8:
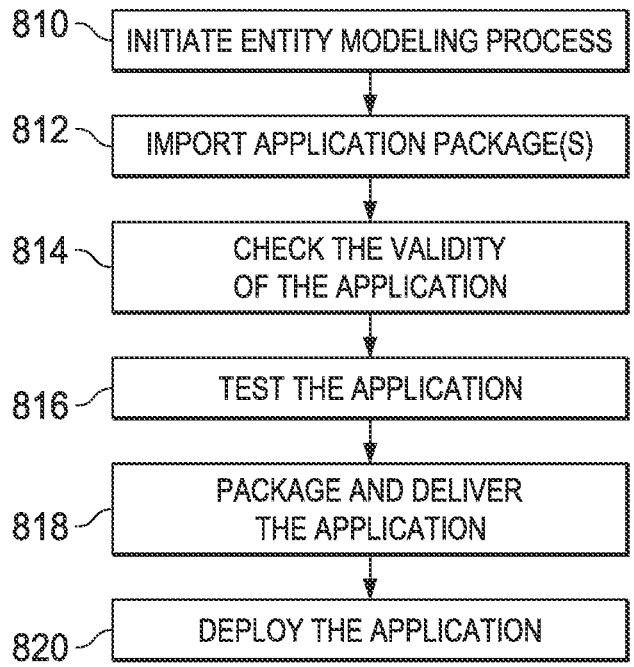
FIG. 8 depicts a flowchart illustrating a process of developing an application including reused entities.

In such an example, application development may consist of activities such as: designing or modeling the application, checking the validity of the application, testing the application, packaging and delivering the application, and deploying the application. In general, the application development is similar to the examples described above. FIG. 8 is a flowchart illustrating a process of developing an application including reused entities. In this example, an entity modeling process is initiated to create an entity model (810). When an application developer desires to reuse an entity from another application, instead of independently developing the same application again, the developer will import an entire application package (812). This may be repeated for any desired application packages that are reused. Once imported, all the reusable models in the imported packages will be available for use by the developer. As described above, the developer may go through an entity modeling process to generate a desired entity model (for example, see FIGS. 2-6). In the example illustrated in FIG. 8, the developer checks the validity of the application (814) and then tests the application (816). Once tested, the application is packaged and delivered (818). Finally, the application is deployed (820).

An application developer should be aware that in some instances, design-time models may have a different application programming interface (API) than their run-time counterparts. Therefore, the application developer may not always be able to rely on the run-time models when developing another application. In other words, when developing an application using reused models from other applications, the developer may need to have a version of the reused model exposing the design-time API. Typically, application packages contain only the run-time versions of the models. In some embodiments, to enable applications to reuse models from other applications, the design-time APIs of the models are also provided to the developer. In some embodiments, this is accomplished by including the run-time models with an application package. As mentioned, conventional application packages only contain the models that are deployed to the respective run-time repositories. It is possible, though, that the run-time contract of a model is different from the design-time contract. Therefore, in some embodiments, contracts for the entities are included when creating the application package.

When an application developer reuses entities from other applications, it may be important that the entity's contract include all items needed by the developer. In some embodiments, for every property of an entity, the entity's contract contains the name of the property and the corresponding data type. An application developer can then refer to these properties when expressing business logic, for example. In some embodiments, the contract will include an internal name of the property, rather than a translatable display name. In some examples, the architecture of a translation framework may require the design-time translation information as part of the package. In some examples, including only the name and data type of each property may not be sufficient. For example, when specifying business logic on an enumerated property, the enumerated values should be available for use, since the different values will give rise to different behaviors. This enables an application developer to expose and import an entity's public relationships and its type and multiplicity, so the developer can refer to these relationships when expressing business logic. In some examples, the enumerated values in the entity's contract will only contain the internal values and not their display names. In addition to properties and relationships, an entity's contract may also include worklists and forms. An application developer may desire to expose an imported entity's worklists, so that the developer can refer to the worklists for browse controls in forms when having relationships to that entity. Similarly, an application developer may desire to expose an imported entity's forms, so that the developer can use these forms as sub-forms.

In some embodiments, an application developer may wish to control which of the developer's models are available for reuse by other developers. For example, the developer may wish to have the freedom to change non-exposed models without a need to consider the possible impact on other developers using the models. In some embodiments, by including model contracts with application packages, opportunities arise to distinguish between private and public models. In some embodiments, a mechanism is included to mark whether or not to expose a model for reuse by other developers. In this example, the contract can be included with the application package when the model is marked public. Alternatively, the model's contract can always be included with the application package, regardless whether it is a private or public model.

One consideration regarding the reusability of models relates to updates. As models are updated with newer versions, users of those models will want to make sure that corresponding applications also work properly with the updated models. In some embodiments, mechanisms are included enabling newer versions of already imported application packages to be imported. In some examples, the system can leave unchanged models intact and replace updated models with the newer version, while making sure that references to these models remain intact.

Figure 9:
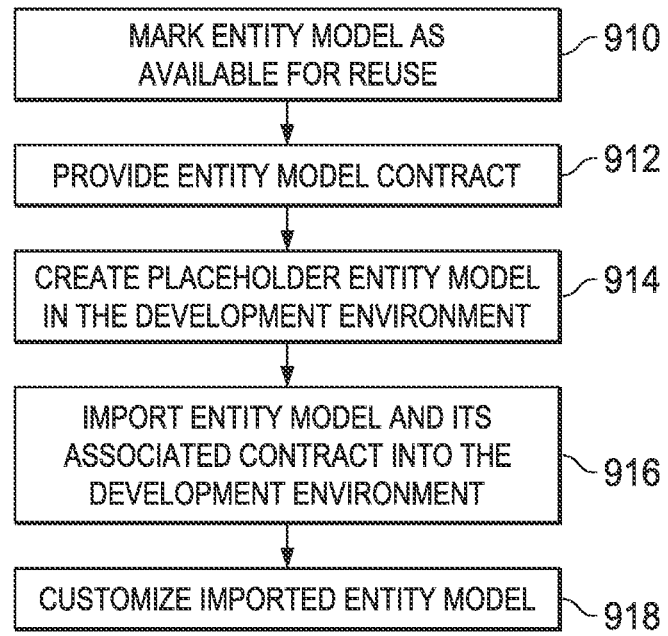
FIG. 9 is a flowchart illustrating a process of reusing an entity model.

FIG. 9 is a flowchart illustrating a process of reusing an entity model. In some embodiments, application developers can control which of their entity models are available for reuse by other developers. When an application developer wishes to make an entity model available for reuse by other developers, the entity model is marked as available for reuse (910). The entity model may be marked using any desired mechanism. When an entity model is marked as available (e.g., marked as public), the contract of the entity model is included with the respective application package (912). In the development environment, an application developer who wishes to reuse the entity model that was marked as available for reuse creates a placeholder entity model (914). In the development environment, the application developer imports the entity model (including its associated contract) that was marked as available for reuse (916). Once the entity model is imported, the entity model can be customized by the application developer, as desired (918).

In some examples, entity models can be reused and also subtyped. For example, in the insurance industry, there may be a claims management process that is mostly the same for different types of insurance claims (e.g., life insurance, auto insurance, etc.). The basic flow of such a process may be the same for different types of insurance. A developer can create a claim entity and include items that are common to various types of insurance claims. This entity can be extended or subtyped to create applications for auto claims, life insurance claims, etc. A developer can then use whatever properties, building blocks, etc. are desired for a particular type of insurance claim. As a result, a significant portion of the development can be shared and reused.

An entity can be created or configured in any manner desired, including the examples described above. For example, a method for composing an entity in a process solution may include a user (e.g., a solution builder) accessing an entity composition function of an entity model designer tool of an entity modeling system via a graphical user interface running on a client device. In some embodiments, the user can use an entity model designer tool to define in a process solution each top-level entity, its child entities, and relations to other entities. More specifically, responsive to an instruction from a user to model an entity, an entity model designer tool may generate a view containing a name of the entity and entity composition function and display the view on graphical user interface. Other examples are also possible.

Through the process of creating, configuring, editing, etc., an entity, a user can generate a customized version of an application provided by a vendor. This customization results from the user's selection of one or more building blocks from a collection of building blocks that comprise an entity. The user can add and remove entity building blocks using an entity composition function which may be implemented via a set of toolbar functions such as an add function, a delete function, etc. The user may also view a settings view that shows the settings for a desired entity building block. In such a settings view, a user can configure various settings of the building block(s), examples of which are provided below.

As described above, applications can be customized and extended in many ways by a user. One problem with users customizing applications is that typically, when an application is updated, the users' customizations get overridden or removed. Generally, the present disclosure describes a system where users' customizations are created and stored independently from the underlying application. When the application developer releases a new version of the application, a user of the application can install the updated version of the application on their system, and the previously configured customizations are still applied to the new application version, for example merged with the new application version at run time. The customizations may be applied to the application in any desire manner. In one example, the system includes a layering mechanism that enables a customizations and application to run on separate layers.

FIG. 10 is a flowchart illustrating a process of a user adding and customizing building blocks to an entity model, for example, using the entity modeling system described above and shown in FIG. 1, according to some embodiments. In this example, a user adds one or more building blocks to an entity model, using an entity modeling system (1010). In some examples, the building blocks may be structural building blocks, functional building blocks, and/or decorative building blocks. Details and examples of these and other types of building blocks are discussed in detail above. For each building block added, the user may customize/configure the building block, for example, by configuring settings and parameters (1012). Detailed examples of customizations are discussed in detail above. As shown in FIG. 10, steps 1010 and 1012 operate in a loop, until a designer is finished adding and configuring building blocks.

As mentioned above, in some embodiments, user customizations (e.g., any configured settings, any configured parameters, etc.) are stored separately from the underlying application, to ensure that the user customizations are preserved, in the event that the underlying application (e.g., building block) is updated or changed (described below). In this example, the system will track and store information relating to each building block customization (1014). The information may be stored in any desired manner, for example, in a database. Finally, the application is deployed (1016).

FIG. 11 is a flowchart illustrating a process of a user receiving an application from an application vendor, customizing the application, and the customizations being applied to an updated version of the application. In this example, assume that a user has deployed an application package that they bought. The user can then go into the design time environment and import the same application in the design time environment. The user can then customize the application, as desired. In some embodiments, an application is received from an application vendor and imported in a design time environment (1110). A user then customizes the application, for example, by configuring settings, configuring parameters, etc., to effectively generate a customized application (1112). To preserve the user customizations, the system stores application customization information. Next, the application is packaged and deployed, and the user's customizations are applied to the application (1114). In some embodiments, the application customization information includes enough information that the same customizations can be applied to the application, or an updated version of the application at a later time.

When the application vendor offers an updated version of the original (non-customized) application, the user may receive and install the updated version application of the application on their system (1116). Since the application customization information was saved separately from the previous version of the application, the system can use the application customization information to apply the same customizations to the updated version of the application (1118). As a result, the user is able to always use the latest version of the application, without having to recreate the previously configured customizations. This saves the user time and reduces expenses.

FIG. 12 is a flowchart illustrating a process similar to that depicted in FIG. 11 applied to an entity modeling system, according to some embodiments. In this example, an entity modeling process is initiated to create an entity model (1210). The entity modeling process can be comprised of any desired process, such as those described above. In this example, a user adds one or more building blocks to the entity model (1212), for example, using an entity modeling system such as that depicted in FIG. 1. In some examples, the building blocks may be structural building blocks, functions building block, and/or decorative building blocks. Details and examples of these and other types of building blocks are discussed in detail above. For each building block added, the user may customize the building block, for example, by configuring settings and parameters (1214). Detailed examples of customizations are discussed in detail above.

As mentioned above, in some embodiments, user customizations (e.g., configured settings, configured parameters, etc.) are stored separately from the underlying application, to ensure that the user customizations are preserved, in the event that the underlying application (e.g., building block) is updated or changed. In this example, the system tracks and stores customization information relating to each building block customization (1216). The information may be stored in any desired manner, for example, in a database, such as database 1418 (described below).

Figure 13:
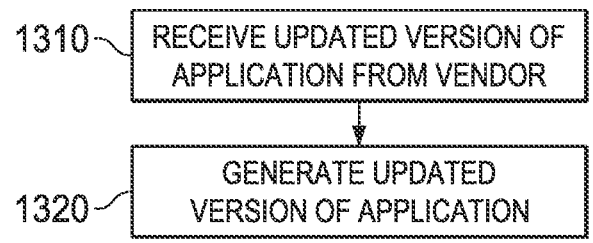
FIG. 13 depicts a flowchart illustrating one example of a user receiving an updated version of an application according to some embodiments.

FIG. 13 is a flowchart illustrating a process of a user receiving an updated version of an application according to some embodiments. When an application vendor offers an updated version of their application, the user may receive and install the updated version on their system (1310). Since the customization information was stored separately from the previous version of the respective building blocks, the system can use the customization information to apply the same customizations to the updated version of the applica-tion (1320). As a result, the user is able to always use the latest version of the application, without having to recreate the previously configured customizations. This saves the user time and reduces expenses.

As mentioned above, one problem in the art relates to polymorphic relationships between entities. In the example provided above, an insurance company may have different types of insurance policies, all of which go through a standard claims process. As mentioned, it may be desirable to process all types of claims, without necessarily being concerned about the type of policy. The mechanisms described above can address this problem. For example, a "claim" base entity can be defined that includes all of the standard functionality of all types of claims. This base entity can then be extended to define all types of claims (e.g., medical claims, auto claims, property claims, etc.). The base claim process works with the base entity. The properties and building blocks of the base entity are made part of the contract that the process expects. The base process can sub-process processes specific to the actual claim type that can interact with the type specific claim properties.

Figure 14:
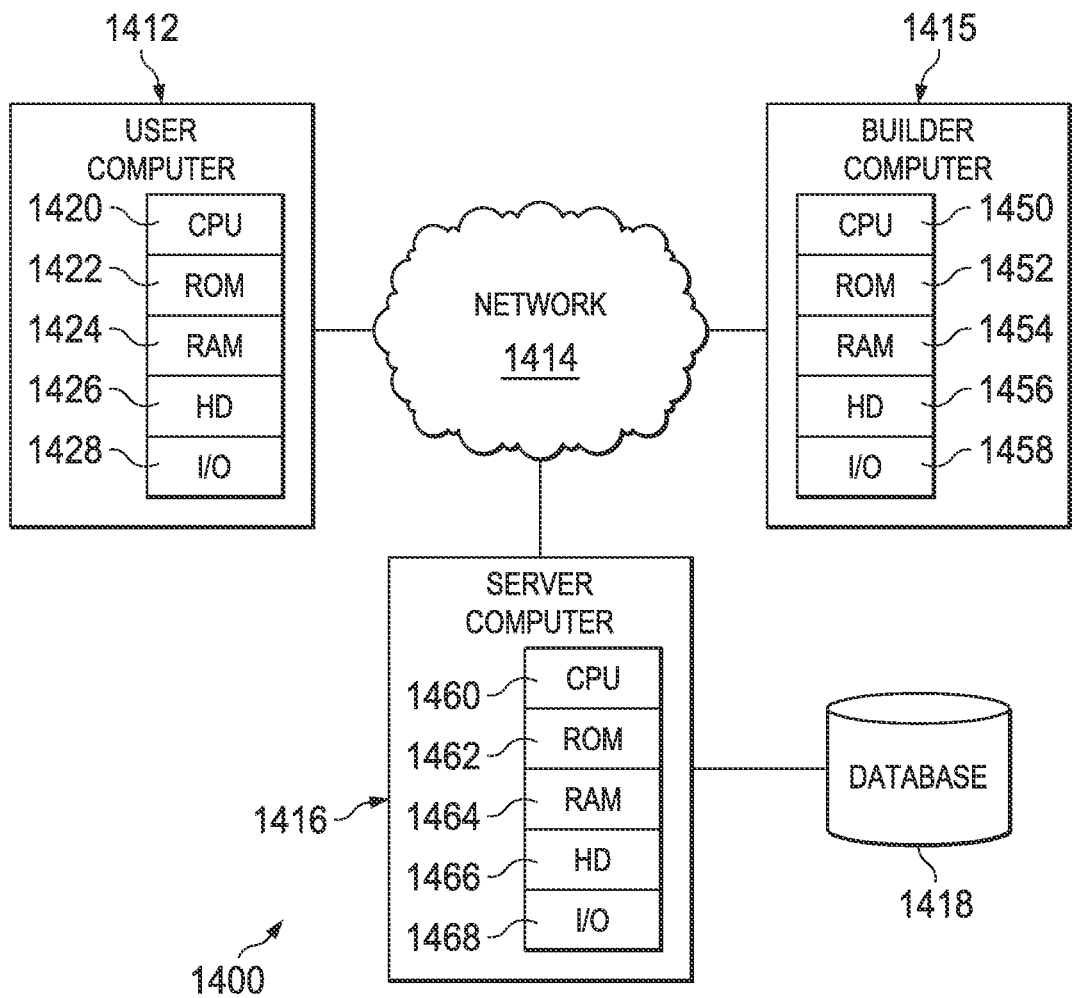
FIG. 14 depicts a diagrammatic representation of an example of an enterprise computing environment where embodiments disclosed can be implemented.

FIG. 14 illustrates an exemplary architecture for enterprise computing environment 1400 that includes network 1414 that can be bi-directionally coupled to user computer 1412, builder computer 1415, and server computer 1416. Server computer 1416 can be bi-directionally coupled to database 1418. Network 1414 may represent a combination of internal and external networks that enterprise computing environment 1400 may utilize for various types of network communications known to those skilled in the art.

For the purpose of illustration, a single system is shown for each of user computer 1412, builder computer 1415, and server computer 1416. However, within each of user computer 1412, builder computer 1415, and server computer 1416, a plurality of computers (not shown) may be interconnected to each other over network 1414. For example, a plurality of user computers 1412 and a plurality of builder computers 1415 may be coupled to network 1414. User computers 1412 may include data processing systems for individuals whose jobs may not require them to develop applications. Builder computers 1415 may include data processing systems for individuals whose jobs may require them to develop applications for use in enterprise computing environment 1400.

User computer 1412 can include central processing unit ("CPU") 1420, read-only memory ("ROM") 1422, random access memory ("RAM") 1424, hard drive ("HD") or storage memory 1426, and input/output device(s) ("I/O") 1428. I/O 1429 can include a keyboard, monitor, printer, electronic pointing device (e.g., mouse, trackball, stylus, etc.), or the like. User computer 1412 can include a desktop computer, a laptop computer, a personal digital assistant, a cellular phone, or nearly any device capable of communicating over a network. Builder computer 1415 may be similar to user computer 1412 and can comprise CPU 1450, ROM 1452, RAM 1454, HD 1456, and I/O 1458.

Likewise, server computer 1416 may include CPU 1460, ROM 1462, RAM 1464, HD 1466, and I/O 1468. Server computer 1416 may include one or more backend systems employed by an enterprise to operate and/or maintain information in enterprise computing environment 1400. One example of such a backend system can be a database management system for database 1418. Many other alternative configurations are possible and known to skilled artisans.

Each of the computers in FIG. 14 may have more than one CPU, ROM, RAM, HD, I/O, or other hardware components.

For the sake of brevity, each computer is illustrated as having one of each of the hardware components, even if more than one is used. Each of computers 1412, 1415, and 1416 is an example of a data processing system. ROM 1422, 1452, and 1462; RAM 1424, 1454, and 1464; HD 1426, 1456, and 1466; and database 1418 can include media that can be read by CPU 1420, 1450, or 1460. Therefore, these types of memories include non-transitory computer-readable storage media. These memories may be internal or external to computers 1412, 1415, or 1416.

Portions of the methods described herein may be implemented in suitable software code that may reside within ROM 1422, 1452, or 1462; RAM 1424, 1454, or 1464; or HD 1426, 1456, or 1466. In addition to those types of memories, the instructions in an embodiment disclosed herein may be contained on a data storage device with a different computer-readable storage medium, such as a hard disk. Alternatively, the instructions may be stored as software code elements on a data storage array, magnetic tape, floppy diskette, optical storage device, or other appropriate data processing system readable medium or storage device.

Those skilled in the relevant art will appreciate that the invention can be implemented or practiced with other computer system configurations, including without limitation multi-processor systems, network devices, mini-computers, mainframe computers, data processors, and the like. The invention can be embodied in a computer or data processor that is specifically programmed, configured, or constructed to perform the functions described in detail herein. The invention can also be employed in distributed computing environments, where tasks or modules are performed by remote processing devices, which are linked through a communications network such as a local area network (LAN), wide area network (WAN), and/or the Internet. In a distributed computing environment, program modules or subroutines may be located in both local and remote memory storage devices. These program modules or subroutines may, for example, be stored or distributed on computer-readable media, including magnetic and optically readable and removable computer discs, stored as firmware in chips, as well as distributed electronically over the Internet or over other networks (including wireless networks). Example chips may include Electrically Erasable Programmable Read-Only Memory (EEPROM) chips. Embodiments discussed herein can be implemented in suitable instructions that may reside on a non-transitory computer-readable medium, hardware circuitry or the like, or any combination and that may be translatable by one or more server machines. Examples of a non-transitory computer-readable medium are provided below in this disclosure.

ROM, RAM, and HD are computer memories for storing computer-executable instructions executable by the CPU or capable of being compiled or interpreted to be executable by the CPU. Suitable computer-executable instructions may reside on a computer-readable medium (e.g., ROM, RAM, and/or HD), hardware circuitry or the like, or any combination thereof. Within this disclosure, the term "computer-readable medium" is not limited to ROM, RAM, and HD and can include any type of data storage medium that can be read by a processor. Examples of computer-readable storage media can include, but are not limited to, volatile and non-volatile computer memories and storage devices such as random access memories, read-only memories, hard drives, data cartridges, direct access storage device arrays, magnetic tapes, floppy diskettes, flash memory drives, optical data storage devices, compact-disc read-only memories, and other appropriate computer memories and data storage devices. Thus, a computer-readable medium may refer to a data cartridge, a data backup magnetic tape, a floppy diskette, a flash memory drive, an optical data storage drive, a CD-ROM, ROM, RAM, HD, or the like.

The processes described herein may be implemented in suitable computer-executable instructions that may reside on a computer-readable medium (for example, a disk, CD-ROM, a memory, etc.). Alternatively, the computer-executable instructions may be stored as software code components on a direct access storage device array, magnetic tape, floppy diskette, optical storage device, or other appropriate computer-readable medium or storage device.

Any suitable programming language can be used to implement the routines, methods or programs of embodiments of the invention described herein, including C, C++, Java, JavaScript, HTML, or any other programming or scripting code, etc. Other software/hardware/network architectures may be used. For example, the functions of the disclosed embodiments may be implemented on one computer or shared/distributed among two or more computers in or across a network. Communications between computers implementing embodiments can be accomplished using any electronic, optical, radio frequency signals, or other suitable methods and tools of communication in compliance with known network protocols.

Different programming techniques can be employed such as procedural or object oriented. Any particular routine can execute on a single computer processing device or multiple computer processing devices, a single computer processor or multiple computer processors. Data may be stored in a single storage medium or distributed through multiple storage mediums, and may reside in a single database or multiple databases (or other data storage techniques). Although the steps, operations, or computations may be presented in a specific order, this order may be changed in different embodiments. In some embodiments, to the extent multiple steps are shown as sequential in this specification, some combination of such steps in alternative embodiments may be performed at the same time. The sequence of operations described herein can be interrupted, suspended, or otherwise controlled by another process, such as an operating system, kernel, etc. The routines can operate in an operating system environment or as stand-alone routines. Functions, routines, methods, steps, and operations described herein can be performed in hardware, software, firmware, or any combination thereof.

Embodiments described herein can be implemented in the form of control logic in software or hardware or a combination of both. The control logic may be stored in an information storage medium, such as a computer-readable medium, as a plurality of instructions adapted to direct an information processing device to perform a set of steps disclosed in the various embodiments. Based on the disclosure and teachings provided herein, a person of ordinary skill in the art will appreciate other ways and/or methods to implement the invention.

It is also within the spirit and scope of the invention to implement in software programming or code an of the steps, operations, methods, routines or portions thereof described herein, where such software programming or code can be stored in a computer-readable medium and can be operated on by a processor to permit a computer to perform any of the steps, operations, methods, routines or portions thereof described herein. The invention may be implemented by using software programming or code in one or more digital computers, by using application specific integrated circuits, programmable logic devices, field programmable gate arrays, optical, chemical, biological, quantum or nano-engineered systems, components, and mechanisms may be used. In general, the functions of the invention can be achieved by any means as is known in the art. For example, distributed, or networked systems, components, and circuits can be used. In another example, communication or transfer (or otherwise moving from one place to another) of data may be wired, wireless, or by any other means.

A "computer-readable medium" may be any medium that can contain, store, communicate, propagate, or transport the program for use by or in connection with the instruction execution system, apparatus, system, or device. The computer-readable medium can be, by way of example only but not by limitation, an electronic, magnetic, optical, electromagnetic, infrared, or semiconductor system, apparatus, system, device, propagation medium, or computer memory. Such computer-readable medium shall generally be machine readable and include software programming or code that can be human readable (e.g., source code) or machine readable (e.g., object code). Examples of non-transitory computer-readable media can include random access memories, read-only memories, hard drives, data cartridges, magnetic tapes, floppy diskettes, flash memory drives, optical data storage devices, compact-disc read-only memories, and other appropriate computer memories and data storage devices. In an illustrative embodiment, some or all of the software components may reside on a single server computer or on any combination of separate server computers. As one skilled in the art can appreciate, a computer program product implementing an embodiment disclosed herein may comprise one or more non-transitory computer-readable media storing computer instructions translatable by one or more processors in a computing environment.

A "processor" includes any, hardware system, mechanism or component that processes data, signals or other information. A processor can include a system with a central processing unit, multiple processing units, dedicated circuitry for achieving functionality, or other systems. Processing need not be limited to a geographic location, or have temporal limitations. For example, a processor can perform its functions in "real-time," "offline," in a "batch mode," etc. Portions of processing can be performed at different times and at different locations, by different (or the same) processing systems.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, product, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, a term preceded by "a" or "an" (and "the" when antecedent basis is "a" or "an") includes both singular and plural of such term, unless clearly indicated otherwise (i.e., that the reference "a" or "an" clearly indicates only the singular or only the plural). Also, as used in the description herein, the meaning of "in" includes "in" and "on" unless the context clearly dictates otherwise.

It will also be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/figures should be considered only as exemplary, and not limiting, unless otherwise specifically noted. Accordingly, the scope of this disclosure should be determined by the following claims and their legal equivalents.

What is claimed is:

1. A method, comprising:
   importing a package, the package including a configured model of an entity and a file associated with the configured entity model, the file containing a property name and corresponding data type for every property of the entity;
   generating a generic model for an entity;
   importing the configured model into the generic model, the importing including adding entity building blocks of the entity associated with the configured model to the entity under development, the importing producing a model for the entity under development;
   receiving user-specified configuration information for the entity building blocks of the entity under development; and
   customizing, based at least in part on the user-specified configuration information for the entity building blocks, the entity under development, wherein the user-specified configuration information for the entity building blocks comprise entity building block settings under development, the customizing having no effect on the configured entity model or the entity associated therewith.

2. The method according to claim 1, wherein each property of the entity represents an entity building block in the configured model of the entity and wherein the entity building block corresponds to an element of an application development environment.

3. The method according to claim 1, further comprising:
   storing a new model of the entity based on the customizing; and
   marking the new model of the entity as public.

4. The method according to claim 1, wherein the customizing comprises deleting an entity building block imported into the generic model, adding an entity building block to the generic model, or editing an entity building block setting of an imported entity building block.

5. The method according to claim 1, further comprising:
   updating an application on a user device with customization information from the customizing, wherein the customization information is saved on the user device separate from a previous version of the application.

6. The method according to claim 1, further comprising:
   applying customization information from the customizing to an application that utilizes the entity.

7. The method according to claim 1, further comprising:
   tracking and storing customization information from the customizing in a database.

8. A system, comprising:
   a processor;
   a non-transitory computer-readable medium; and
   instructions stored on the non-transitory computer-readable medium and translatable by the processor for:
      importing a package, the package including a configured model of an entity and a file associated with the configured entity model, the file containing a property name and corresponding data type for every property of the entity;

generating a generic model for an entity;

importing the configured model into the generic model, the importing including adding entity building blocks of the entity associated with the configured model to the entity under development, the importing producing a model for the entity under development;

receiving user-specified configuration information for the entity building blocks of the entity under development; and customizing, based at least in part on the user-specified configuration information for the entity building blocks, the entity under development, wherein the user-specified configuration information for the entity building blocks comprise entity building block settings under development, the customizing having no effect on the configured entity model or the entity associated therewith.

9. The system of claim 8, wherein each property of the entity represents an entity building block in the configured model of the entity and wherein the entity building block corresponds to an element of an application development environment.

10. The system of claim 8, wherein the instructions are further translatable by the processor for:

storing a new model of the entity based on the customizing; and marking the new model of the entity as public.

11. The system of claim 8, wherein the customizing comprises deleting an entity building block imported into the generic model, adding an entity building block to the generic model, or editing an entity building block setting of an imported entity building block.

12. The system of claim 8, wherein the instructions are further translatable by the processor for:

updating an application on a user device with customization information from the customizing, wherein the customization information is saved on the user device separate from a previous version of the application.

13. The system of claim 8, wherein the instructions are further translatable by the processor for:

applying customization information from the customizing to an application that utilizes the entity.

14. The system of claim 8, wherein the instructions are further translatable by the processor for:

tracking and storing customization information from the customizing in a database.

15. A computer program product comprising a non-transitory computer-readable medium storing instructions translatable by a processor for:

importing a package, the package including a configured model of an entity and a file associated with the configured entity model, the file containing a property name and corresponding data type for every property of the entity;

generating a generic model for an entity;

importing the configured model into the generic model, the importing including adding entity building blocks of the entity associated with the configured model to the entity under development, the importing producing a model for the entity under development;

receiving user-specified configuration information for the entity building blocks of the entity under development; and customizing, based at least in part on the user-specified configuration information for the entity building blocks, the entity under development, wherein the user-specified configuration information for the entity building blocks comprise entity building block settings under development, the customizing having no effect on the configured entity model or the entity associated therewith.

16. The computer program product of claim 15, wherein each property of the entity represents an entity building block in the configured model of the entity and wherein the entity building block corresponds to an element of an application development environment.

17. The computer program product of claim 15, wherein the instructions are further translatable by the processor for:

storing a new model of the entity based on the customizing; and marking the new model of the entity as public.

18. The computer program product of claim 15, wherein the customizing comprises deleting an entity building block imported into the generic model, adding an entity building block to the generic model, or editing an entity building block setting of an imported entity building block.

19. The computer program product of claim 15, wherein the instructions are further translatable by the processor for:

updating an application on a user device with customization information from the customizing, wherein the customization information is saved on the user device separate from a previous version of the application.

20. The computer program product of claim 15, wherein the instructions are further translatable by the processor for:

applying customization information from the customizing to an application that utilizes the entity.

* * * * *